US010475517B2

(12) United States Patent
Battaje et al.

(10) Patent No.: US 10,475,517 B2
(45) Date of Patent: Nov. 12, 2019

(54) CHARACTERIZING AND OPERATING A NON-VOLATILE MEMORY DEVICE

(71) Applicant: Western Digital Technologies, Inc., San Jose, CA (US)

(72) Inventors: Ajith Kumar Battaje, Karnataka (IN); Mahesh Mandya Vardhamanaiah, Karnataka (IN); Ashwin Narasimha, Los Altos, CA (US); Sandeep Sharma, Karnataka (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/116,806

(22) Filed: Aug. 29, 2018

(65) Prior Publication Data

US 2019/0066801 A1 Feb. 28, 2019

Related U.S. Application Data

(63) Continuation of application No. 15/484,038, filed on Apr. 10, 2017, now Pat. No. 10,068,650, which is a continuation of application No. 14/991,484, filed on Jan. 8, 2016, now Pat. No. 9,620,227.

(51) Int. Cl.
| | | |
|---|---|---|
| G11C 16/06 | (2006.01) | |
| G11C 16/16 | (2006.01) | |
| G11C 29/52 | (2006.01) | |
| G11C 16/10 | (2006.01) | |
| G11C 29/34 | (2006.01) | |
| G11C 29/42 | (2006.01) | |
| G11C 29/44 | (2006.01) | |
| G11C 29/04 | (2006.01) | |

(52) U.S. Cl.
CPC ............ *G11C 16/16* (2013.01); *G11C 16/107* (2013.01); *G11C 29/34* (2013.01); *G11C 29/42* (2013.01); *G11C 29/44* (2013.01); *G11C 29/52* (2013.01); *G11C 2029/0409* (2013.01); *G11C 2029/4402* (2013.01)

(58) Field of Classification Search
CPC . G11C 2029/4402; G11C 16/26; G11C 16/10; G11C 16/225; G11C 29/42; G11C 29/52; G11C 16/107; G11C 16/16; G11C 2029/0409; G11C 29/34; G11C 29/44; G11C 11/5628; G11C 16/349
USPC ............ 365/185.11, 185.18, 185.03, 185.12, 365/185.24, 185.29, 185.33
See application file for complete search history.

(56) References Cited

U.S. PATENT DOCUMENTS

2014/0269053 A1* 9/2014 Chen ........................ G11C 7/24
365/185.03

\* cited by examiner

*Primary Examiner* — Thong Q Le
(74) *Attorney, Agent, or Firm* — Morgan, Lewis & Bockius LLP (57) ABSTRACT

A sequence of contiguous pages in an erase block in a non-volatile memory device is programmed and erased. Next, all of the pages in the erase block are programmed with data. Then, the data is read back and verified to determine whether there is an error in the data. When there is an error in the data, then the last page in the sequence is identified as being unstable. If there is no error in the data, then the last page in that sequence is identified as being stable. Thus, the recorded information identifies a point of instability in the erase block. Instabilities can be stabilized by performing additional writes to fill the partially filled word line.

20 Claims, 7 Drawing Sheets

CHARACTERIZING AND OPERATING A NON-VOLATILE MEMORY DEVICE

CROSS-REFERENCE TO RELATED APPLICATIONS

The present application claims the benefit of priority under 35 U.S.C. § 120 as a continuation of U.S. patent application Ser. No. 15/484,038, entitled "Characterizing and Operating a Non-Volatile Memory Device," filed Apr. 10, 2017, which claims the benefit of priority under 35 U.S.C. § 120 as a continuation of U.S. patent application Ser. No. 14/991,484, entitled "Characterizing and Operating a Non-Volatile Memory Device," filed Jan. 8, 2016, now U.S. Pat. No. 9,620,227, the disclosures of which are hereby incorporated by reference in their entirety for all purposes.

BACKGROUND

Businesses accumulate tremendous amounts (e.g., petabytes) of data in databases that are stored on all kinds of media including, for example, tapes, hard disk drives, volatile memory devices such as random access memory (RAM), and non-volatile memory devices (NVMDs) such as solid state drives (SSDs). The use of NVMDs instead of other storage media such as RAM to store large amounts of data presents some challenges. NVMDs have longer read and write latencies relative to, for example, double data rate type three synchronous dynamic RAM (DDR3 DRAM). Also, NVMDs are erased before being written to and can only be erased a limited number of times before wearing out.

On the other hand, the capacity of NVMDs makes them more practical than RAM for storing large amounts of data. Also, when power to RAM is lost or interrupted, the data held by the RAM is lost. NVMDs use NAND-based flash memory, for example, which retains data even when power is lost. Thus, the advantages of NVMDs include their capacity and non-volatility.

The basic unit of each NVMD read/write operation is referred to as a page. There are multiple writeable pages grouped per word line. A typical contemporary word line includes four pages. NVMDs are also organized into erase blocks. An erase block is the smallest unit at which data can be erased from an NVMD. Each erase block includes multiple pages. A typical contemporary erase block may include, for example, 512 pages.

To mitigate their longer access time (read and write latencies), data is written to NVMDs in parallel. In general, writes are made in a controlled or systematic manner. For example, in an erase block containing 512 pages, writes are performed starting at the first page (page 0), proceeding in sequence through the last page (page 511) and then onto the next erase block. However, in high-performance NVMDs, writes may not be performed all the way to the end of an erase block before a switch is made to another erase block. Thus, an erase block may be only partially filled with data, in which case the erase block may contain at least one word line that is only partially written. A word line is said to be partially written if only a subset of the pages in the word line (e.g., less than four pages) have been written (programmed) with data.

An erase block in an NVMD may be unreliable when a word line is only partially written. That is, data written to a page in a partially written word line is vulnerable to a higher than acceptable error rate. A page in which data may be compromised over an acceptable level may be referred to as a weak page or instability.

Recent 2Y 20 nanometer (nm) flash memory devices are particularly susceptible to errors if a partially filled erase block (containing a partially filled word line) is erased. There are not mechanisms that can be used to detect and correct errors due to instability. The instability is such that when the erase block is subsequently written to and then read from, some of the data that is read may be incorrect but cannot be corrected by error-correcting code (ECC) because, for example, the number of erroneous bits exceeds the error-correcting capability of the ECC. This can result in a loss of data. Such errors can be widespread throughout the NVMD to the extent that, under some circumstances, the best or only way to proceed is to avoid using problematic erase blocks. However, this results in a loss of memory capacity.

SUMMARY

Instabilities in an erase block can be stabilized by performing additional writes to fill a partially filled word line. Embodiments according to the present invention pertain to methods that can be used to characterize an NVMD to identify erase blocks, if any, that have instabilities, and to identify where the instabilities within each of those erase blocks are located.

Embodiments according to the invention also pertain to methods that can be used to stabilize instabilities in those erase blocks. Embodiments according to the invention also pertain to NVMDs that utilize those methods.

In an embodiment according to the present invention, a sequence of contiguous pages in an erase block is programmed and erased. Next, all of the pages in the erase block are programmed with data. Then, the data is read back and verified to determine whether there is an error in the data. If there is an error in the data, then the last page in the aforementioned sequence is identified as being unstable. If there is no error in the data, then the last page in that sequence is identified as being stable. An unstable page may be referred to herein as an instability point, and a stable page may be referred to herein as a stability point.

The series of operations described in the preceding paragraph is performed for different sequences of contiguous pages in the erase block. In an embodiment, the operations are performed for the sequence that includes the first page in the erase block (page 0), then for the sequence that includes the first page and the second page (page 1) in the erase block, then for the sequence that includes the first, second, and third pages (pages 0, 1, and 2) in the erase block, and so on until it is performed for all of the pages in the erase block. In such an embodiment, for an erase block that includes N pages (where N is a positive integer), the operations are performed for N different sequences of contiguous pages, where the Mth set of the different sequences consists of M contiguous pages comprising the pages in the erase block corresponding to all integer values of K from K=1 (corresponding to page 0) to K=M (corresponding to page M−1), where M is an integer value from 1 to N inclusive. In this manner, any instability points in the erase block are detected and stability points in the erase block are determined and recorded. The process is repeated for each erase block.

When data is subsequently written to an erase block that has been characterized as just described, information identifying the last page written is recorded. In an embodiment, that information is maintained in DRAM. When the erase block is to be erased, a check is performed before the erase block is erased to determine if the erase block is stabilized. Specifically, a check is performed to determine whether the last page written has reached a stability point for the erase block. If so, the erase block is erased. If not, then dummy data is written to fill the word line containing the last page written. That is, dummy data is written to the erase block until a stability point is passed or at least reached. Once a stability point is reached, then the erase block is erased.

In the event of a planned shutdown, the process just described is performed for each of the erase blocks. That is, prior to the shutdown, the state of each erase block is checked to see if the erase block contains data up to or past a respective stability point. Erase blocks not filled to a stability point are stabilized using dummy data. The shutdown proceeds once all of the erase blocks are stabilized.

In the event of an unplanned (and hence unexpected) shutdown, information about the last page written prior to the shutdown for each erase block may be lost. In that case, in an embodiment, when an instruction is received to erase a particular erase block after an unplanned shutdown (e.g., on bootup following an unplanned shutdown), then that erase block is scanned before it is erased to identify the last page written. That is, the erase block is scanned only if it is to be erased. If the erase Hock is not filled to a stability point, then dummy data is written to the erase block until a stability point is at least reached or passed. Once a stability point is reached, then the erase block is erased. Alternatively, all erase blocks can be scanned during bootup after the unplanned shutdown, to determine the last page written in each erase block.

In summary, in embodiments according to the present invention, stability points of each erase block can be determined and that information can be used to determine whether an erase block is stable and to stabilize an unstable erase block before it is erased. Thus, embodiments according to the present invention improve the reliability of NVMDs (e.g., SSDs such as flash memory devices). Because it is no longer necessary to avoid potentially unstable erase blocks, the capacities of NVMDs are not reduced.

These and other objects and advantages of the various embodiments of the present invention will be recognized by those of ordinary skill in the art after reading the following detailed description of the embodiments that are illustrated in the various drawing figures.

BRIEF DESCRIPTION OF DRAWINGS

The accompanying drawings, which are incorporated in and form a part of this specification and in which like numerals depict like elements, illustrate embodiments of the present disclosure and, together with the detailed description, serve to explain the principles of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "programming," "erasing," "reading," "writing," "determining," "repeating," "recording," "scanning," "receiving," "identifying," "accessing," or the like, refer to actions and processes (e.g., flowcharts 500, 600, 700, and 800 of FIGS. 5, 6, 7, and 8, respectively) of an apparatus or computer system or similar electronic computing device or processor (e.g., the computer system 100 of FIG. 1). A computer system or similar electronic computing device manipulates and transforms data represented as physical (electronic) quantities within memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory (e.g., an SSD or NVMD) or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared and other wireless media. Combinations of any of the above can also be included within the scope of computer-readable media.

Figure 1:
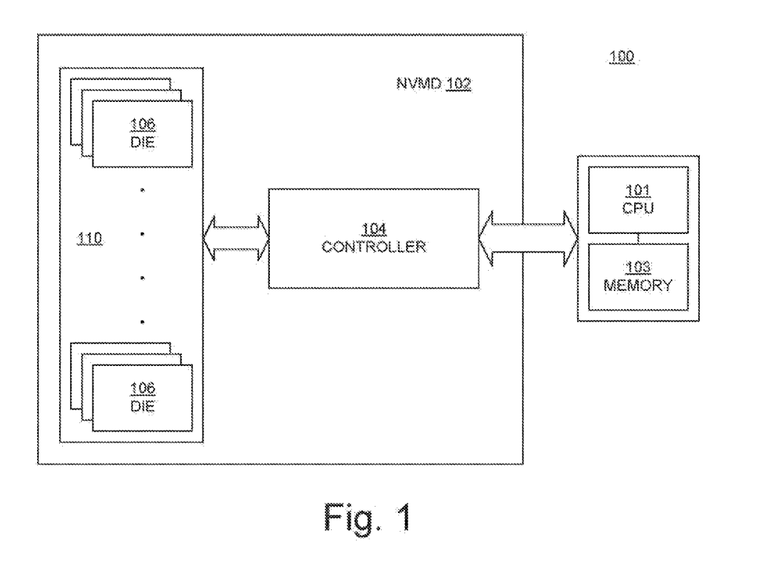
FIG. 1 a block diagram showing elements of a computer system upon which embodiments according to the present invention can be implemented.

FIG. 1 a block diagram showing elements of a computer system or device 100 upon which embodiments according to the present invention can be implemented. The system 100 may include elements other than those shown.

In the example of FIG. 1, the system 100 includes a central processing unit (CPU) 101 and a memory 103. The system 100 is coupled to or incorporates a non-volatile memory device (NVMD) 102, which may also be known as a solid state drive (SSD) or a flash memory device. The memory 103 may be, for example, dynamic random access memory (DRAM).

The NVMD 102 includes a controller 104 and a number of storage elements, specifically a chip array 110 that includes a number of dies or chips 106 that are used to store data. In an embodiment, the dies 106 include any number of non-volatile memory elements such as NAND flash elements, and as such the NVMD 102 may be referred to as a NAND flash device. Alternatively, the dies may include NOR flash elements. There may be any number of dies 106.

The controller 104 can be implemented as an application-specific integrated circuit (ASIC) or field-programmable gate array (FPGA) that is embedded in the NVMD 102. In general, the controller 104 includes control circuitry that facilitates reading, writing, erasing, and other operations on the dies 106. In an embodiment, the controller 104 includes a flash translation layer (FTL), a write path, and a read path. The write path may include a physical layer (PHY) interface and a serializer/deserializer that converts data between the analog and digital domains (from analog to digital, and from digital to analog). The write path may also include a data compression block, an encryption block, and an error correction code (ECC) encoding block. The read path may include an ECC decoding block, a decryption block, and a decompression block. The controller 104 is coupled to the dies 106 via, for example, an Open NAND Interface (ONFI). A chip select (CS) signal is used by the controller 104 to locate, address, and/or activate a particular one of the dies 106.

Figure 2:
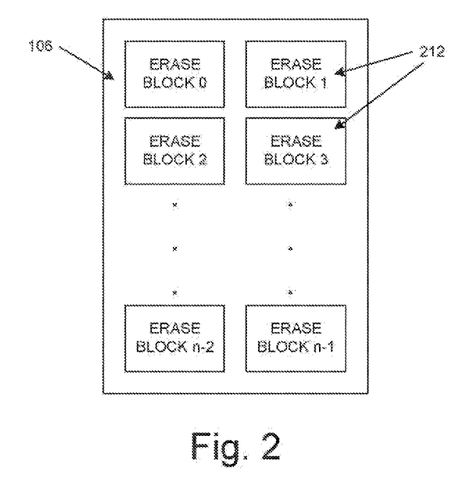
FIG. 2 is a block diagram illustrating a non-volatile memory die (NVMD) in an embodiment according to the present invention.

FIG. 2 is a block diagram illustrating a die 106 in an embodiment according to the present invention. In the example of FIG. 2, the die 106 is organized into a number n of erase blocks 212. Each erase block includes a subset of the non-volatile memory elements located on the die 106. Although the memory elements in the die 106 may be programmed (written) and read in smaller groups (e.g., pages), all memory elements within an erase block are erased together.

Figure 3:
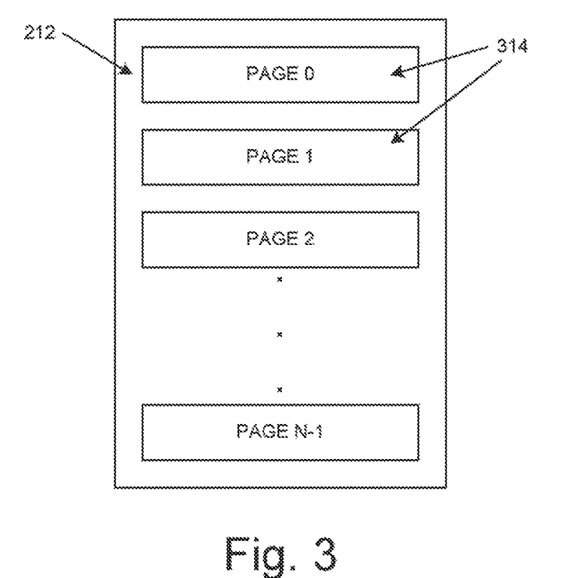
FIG. 3 is a block diagram conceptually illustrating the topology of an erase block in an NVMD die in an embodiment according to the present invention.

FIG. 3 is a block diagram conceptually illustrating the topology of an erase block 212 in an embodiment according to the present invention. In the example of FIG. 3, the erase block 212 is organized into a number N of pages 314. In an embodiment, there are 512 pages in an erase block (pages 0 to N−1). In an embodiment, each page is the same size; each page stores the same amount of data (e.g., 16 kilobytes).

Figure 4A:
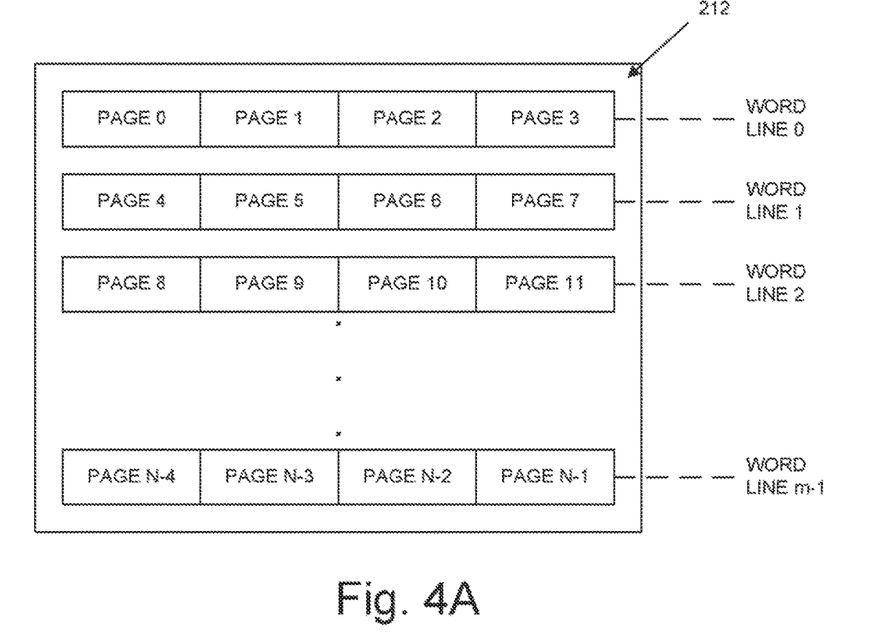
FIG. 4A is a block diagram conceptually illustrating a grouping of pages per word line in the erase block in an embodiment according to the present invention.

FIG. 4A is a block diagram conceptually illustrating a grouping of pages per word line in the erase block 212 in an embodiment according to the present invention. In the example of FIG. 4A, there are four pages per word line; a page is a part of a word line (a single word line). In an embodiment in which the erase block 212 includes 512 pages, there are 128 word lines (m=128). Data is written to the erase block 212 starting at page 0, then to page 1, page 2, and page 3, then to the next word line, and so on. If all of the pages in the erase block 212 are programmed (written, or filled with data), then subsequent data is written to another erase block.

However, as mentioned previously herein, there may be instances in which an erase block is not completely filled (not entirely programmed or written). For example, with reference to FIG. 4B, only the first six pages (pages 0-5) of the erase block 212 may be written (as indicated by the shading in the figure). In that case, word line 0 is filled, but word line 1 is only partially filled (partially written). As mentioned previously herein, an erase block may be unreliable when a word line is only partially written. As will be described below, embodiments according to the present invention pertain to methods that can be used to characterize an NVMD to identify erase blocks, if any, that have instabilities and to identify where instabilities are located within each of those erase blocks. Embodiments according to the invention also pertain to methods that can be used to stabilize instabilities in erase blocks.

In overview, in an embodiment according to the present invention, a sequence of contiguous pages in an erase block is programmed and erased. Next, all of the pages in the erase block are programmed with data. Then, the data is read back and verified to determine whether there is an error in the data. When there is an error in the data, then the last page in the aforementioned sequence is identified as being unstable. If there are no errors in the data, then the last page in that sequence is identified as being stable. An unstable page may be referred to herein as an instability point, and a stable page may be referred to herein as a stability point.

The series of operations described in the preceding paragraph is performed for different sequences of contiguous pages in the erase block. In an embodiment, the operations are performed for the sequence including only the first page in the erase block (page 0), then for the sequence including the first page and the second page (page 1) in the erase block, then for the sequence including the first, second, and third pages (pages 0, 1, and 2) in the erase block, and so on until it is performed for all of the pages in the erase block. As mentioned above, a sequence is programmed and erased, then all of the pages in the erase block are programmed and the data is read back and verified, before the next sequence is programmed and erased. In this manner, any instability points in the erase block are detected and stability points in the erase block are determined. The process is repeated for each erase block.

Figure 5:
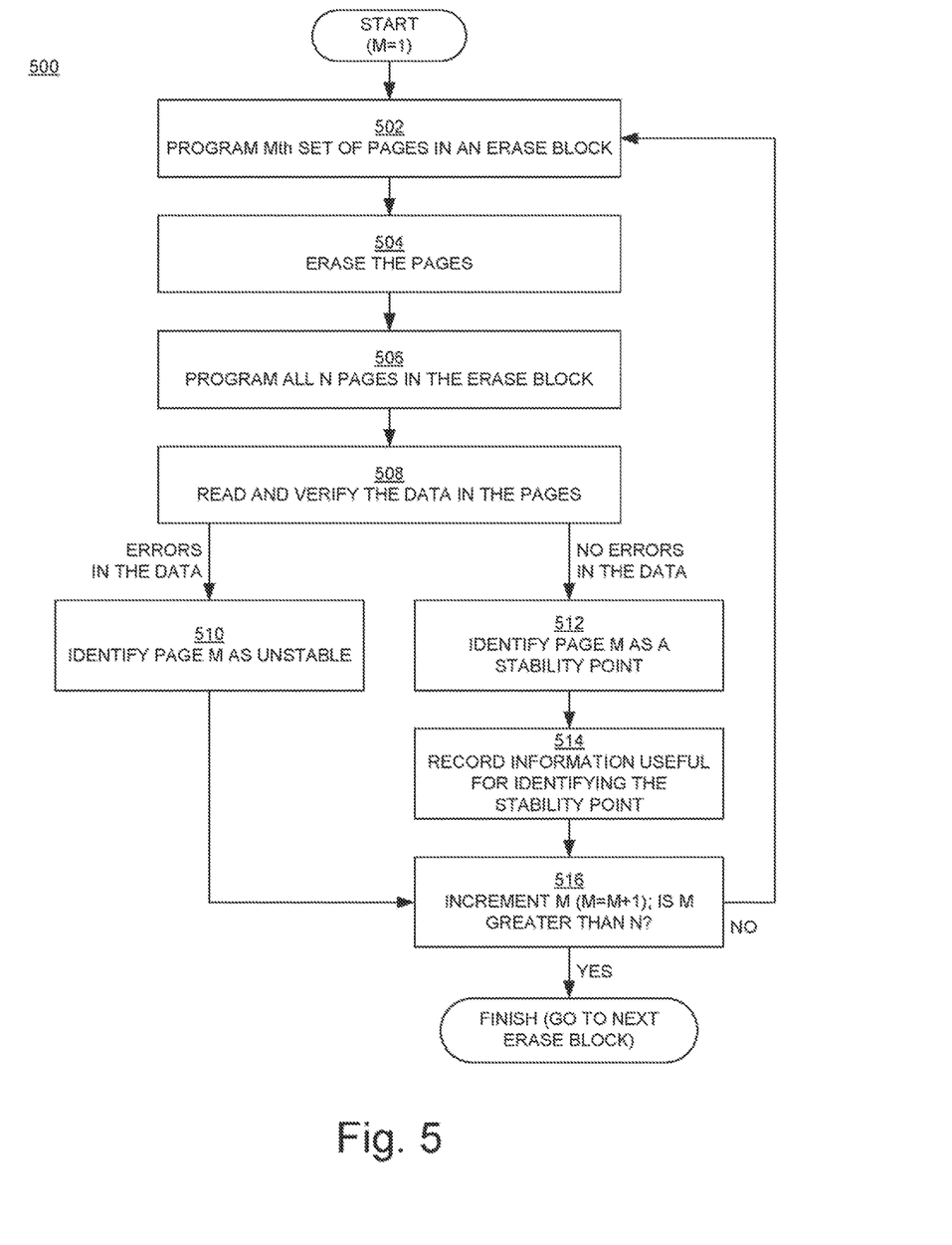
FIG. 5 is a flowchart of a method for characterizing an NVMD in an embodiment according to the present invention.

FIG. 5 is a flowchart 500 of a method for characterizing an NVMD (e.g., the WNW 102 of FIG. 1) organized into n erase blocks (e.g., the erase blocks 212 of FIG. 2) in an embodiment according to the present invention, where each erase block includes N pages and where N is a positive integer. In an embodiment, N=512. In an embodiment, some or all of the operations of the flowchart 500 are performed using an input/output writer and verifier that may be implemented in software executing on a host computer system that is in communication with the NVMD (e.g., like the computer system of FIG. 1).

In block 502, the Mth set consisting of M contiguous pages is programmed. Initially, M=1 and so the first set, consisting of the first page (page 0, corresponding to M=1), is programmed. As will be seen, the value of M is incremented so that the operations about to be described will be repeated for N different sequences of contiguous pages, where the Mth set of the different sequences consists of M contiguous pages comprising the pages in the erase block corresponding to all integer values of K from K=1 to K=M, where M is an integer value from 1 to N inclusive, where K=1 corresponds to page 0, K=2 corresponds to page 1, and so on.

In block 504, the page(s) programmed in block 502 are erased.

In block 506, all N pages in the erase block are programmed. The pages can be programmed with dummy (test) data. The dummy data is a known set of data, so that when the data is subsequently read and verified, any errors in that data will be detected.

In block 508, all of the pages in the erase block are read and verified. If there are errors in the data, then the flowchart 500 proceeds to block 510. Otherwise, the flowchart 500 proceeds to block 512.

In block 510, if there is an error in the data read in block 508, then the page corresponding to the current value of M is identified as being unstable. Note that the page corresponding to the current value of M is the last page in the sequence of contiguous pages that was programmed in block 502.

In block 512, if there are no errors in the data read in block 508, then the page corresponding to the current value of M is identified as being stable. This page may be referred to herein as a stability point for the erase block because, if the erase block past is programmed up to or past that page, then the erase block can be stabilized.

In block 514, information identifying the stability point is recorded. This information can be recorded in any suitable location from which it can be subsequently retrieved. For example, this information can be recorded in the memory of the host computer system that is performing the operations described above and then transferred to a page in the NVMD itself for persistent storage, so that information can subsequently be accessed and used during operation with the NVMD (as will be described in the discussion of FIGS. 6, 7, and 8, below).

In block 516 of FIG. 5, the value of M is incremented (M=M+1). If M is less than or equal to N (not greater than N), then the flowchart 500 returns to block 502. Otherwise, the flowchart ends.

In this manner, the stability points in the erase block are determined and recorded. In an embodiment, only the last stability point in the erase block is recorded; that is, only the stability point having the greatest value for M is recorded. The process described by the flowchart 500 is repeated for each erase block in the NVMD. Note that information that identifies instability points can also be recorded, or information that identifies instability points can be recorded as an alternative to recording information that identifies stability points. In general, information that is useful for identifying stability points is recorded.

It has been observed that erasing a page in an erase block takes longer at stability points. Thus, in an alternative implementation, the amount of time needed to erase a page relative to other pages can be used to identify stability points.

Figure 4B:
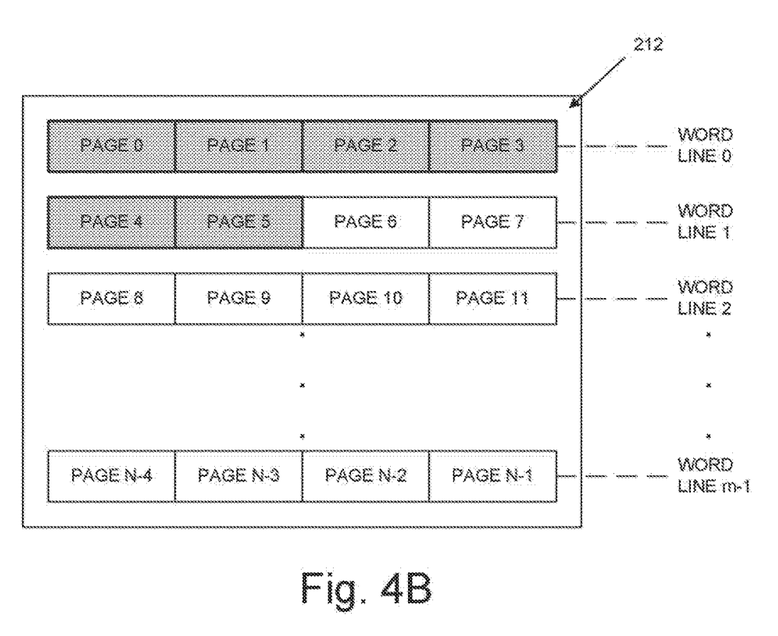
FIG. 4B is a block diagram conceptually illustrating a partially written erase block in an embodiment according to the present invention.

The operations of FIG. 5 are further described by way of example with reference to FIG. 4B. First, page 0 (corresponding to K=M=1) is programmed, then erased. Next, all of the pages in the erase block 212 are programmed (written) with data. Then, all the pages in the erase block 212 are read and the data that is read is verified against the data that was written. If there is an error in the data, then page 0 is identified as an instability point and that information may be recorded. If there are no errors in the data, then page 0 is identified as a stability point and that information is recorded.

Next, pages 0 and 1 (corresponding to M=2 and K=1, 2) are programmed, then erased. Next, all of the pages in the erase block 212 are programmed with data. Then, all the pages in the erase block 212 are read and the data that is read is verified against the data that was written. If there is an error in the data, then page 1 (the last page written in the current sequence) is identified as an instability point and that information may be recorded. If there are no errors in the data, then page 1 is identified as a stability point and that information is recorded.

Next, pages 0, 1, and 2 (corresponding to M=3 and K=1, 2, and 3) are programmed, then erased. Next, all of the pages in the erase block 212 are programmed with data. Then, all the pages in the erase block 212 are read and the data that is read is verified against the data that was written. If there is an error in the data, then page 2 (the last page written in the current sequence) is identified as an instability point and that information may be recorded. If there are no errors in the data, then page 2 is identified as a stability point and that information is recorded.

The process in the example above is repeated until a sequence that consists of all N pages (M=N and K=1, 2, 3, . . . , N−1, N) is programmed, erased, and programmed with data that is read and verified. In this manner, any instability in the erase block 212 will be detected and may be recorded, and stability points in the erase block are also identified and recorded.

Figure 6:
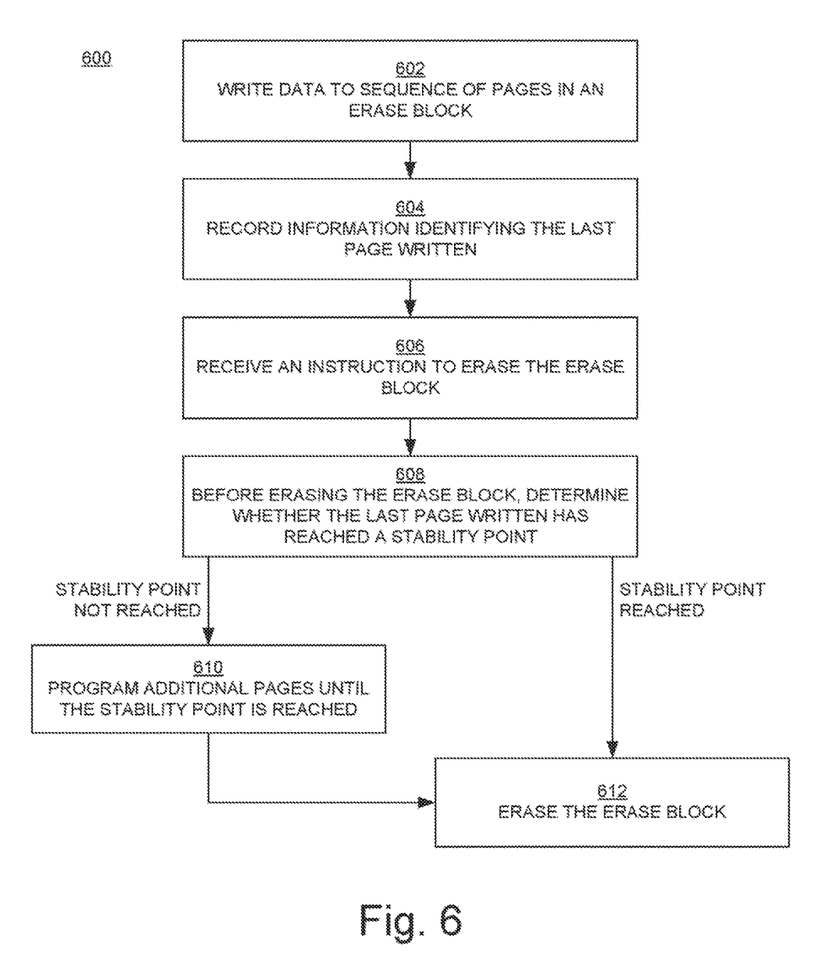
FIG. 6 is a flowchart of a method for operation with an NVMD in an embodiment according to the present invention.

FIG. 6 is a flowchart 600 of a method for operating with an NVMD (e.g., the NVMD 102 of FIG. 1) organized into erase blocks (e.g., the erase blocks 212 of FIG. 2) in an embodiment according to the present invention. The operations of the flowchart 600 are performed after the operations of the flowchart 500 are performed. In an embodiment, some or all of the operations of the flowchart 600 are performed in software executing on a computer system such as the system 100 of FIG. 1.

In block 602 of FIG. 6, data is written to a sequence of pages in an erase block of the NVMD.

In block 604, after the data is written to the erase block, information that identifies the last page in the sequence of pages is recorded. The last page written in the sequence is equivalent to the last page written in the erase block. In an embodiment, that information is recorded in the memory 103 (e.g., DRAM) of FIG. 1, for efficient access and quick lookup.

In block 606, an instruction to erase the erase block is received (e.g., by the controller 104 of FIG. 1).

In block 608, prior to erasing the erase block in response to the instruction, a determination is made as to whether the last page written has reached a stability point for the erase block. More specifically, the information recorded in block 604 can be compared to the information recorded in block 514 of FIG. 5, to determine whether the last page written in the erase block is at or beyond a stability point for the erase block. The stability point for the erase block may be the last stability point in the erase block, or it may the stability point closest to but after the last page written. If the stability point has been reached, then the flowchart 600 proceeds to block 612; otherwise, the flowchart proceeds to block 610.

In block 610, when the last page written has not reached a stability point, additional sequential pages of the erase block are programmed (e.g., with dummy data) until the last page of the additional pages written is at or after a stability point.

In block 612, when a stability point is reached, the erase block can be erased in response to the instruction of block 606.

With reference again to FIG. 4B, consider an example in which a stability point is identified as page 7. In response to an instruction to erase the erase block 212 per block 606 of FIG. 6, the recorded state information that identifies the last page written (page 5 in the example of FIG. 4B) is compared to the recorded information that identifies the stability point before the erase block is erased. Because the written data has not reached the stability point, additional pages (e.g., pages 6 and 7) are programmed (e.g., with dummy data) per block 610 of FIG. 6, so that the additional pages that are written up to or past the stability point. In other words, word line 1, which was previously only partially filled, is now entirely filled with data. In this manner, the erase block 212 is stabilized and can then be erased.

Figure 7:
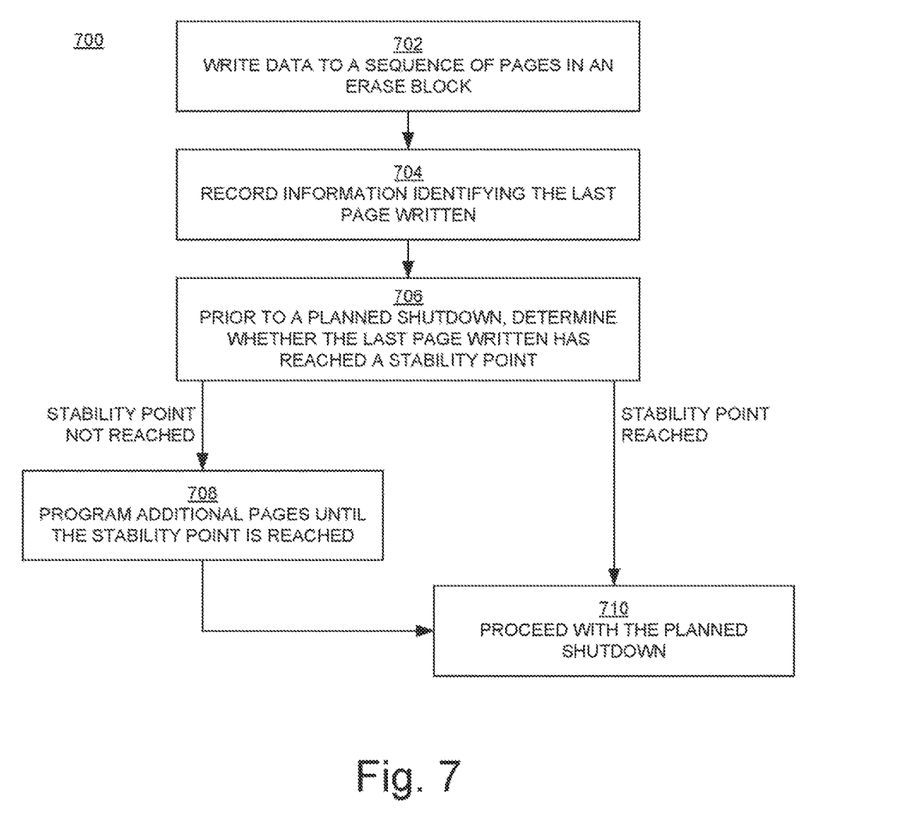
FIG. 7 is a flowchart of a method for performing a planned shutdown of an NVMD in an embodiment according to the present invention.

FIG. 7 is a flowchart 700 of a method for performing a planned shutdown of an NVMD (e.g., the NVMD 102 of FIG. 1) organized into erase blocks (e.g., the erase blocks 212 of FIG. 2) in an embodiment according to the present invention. The operations of the flowchart 700 are performed after the operations of the flowchart 500 are performed. In an embodiment, some or all of the operations of the flowchart 700 are performed in software executing on a computer system such as the system 100 of FIG. 1.

In block 702 of FIG. 7, data is written to a sequence of pages in an erase block of the NVMD.

In block 704, after the data is written to the erase block, information that identifies the last page in the sequence of pages is recorded, for example, in the memory 103 (e.g., DRAM) of FIG. 1.

In block 706, prior to the planned shutdown, a determination is made as to whether the last page written in the erase block has reached a stability point. More specifically, the information recorded in block 704 can be compared to the information recorded in block 514 of FIG. 5, to determine whether the last page written in the erase block is at or beyond a stability point for the erase block. The stability point for the erase block may be the last stability point in the erase block, or it may the stability point closest to but after the last page written. If a stability point has been reached, then the flowchart 700 proceeds to block 710; otherwise, the flowchart proceeds to block 708.

In block 708, when the last page written has not reached a stability point, additional sequential pages of the erase block are programmed (e.g., with dummy data) until the last page of the additional pages written is up to or past a stability point, similar to what is described above in the discussion of FIG. 6.

In block 710 of FIG. 7, when a stability point is reached, the planned shutdown is allowed to proceed.

The operations of the flowchart 700 are performed because the information recorded in block 704 is stored in volatile memory and hence may be lost if power is removed during the shutdown. On the other hand, the data held in the erase block will persist even if power is removed during the shutdown. Hence, the erase block is stabilized before the shutdown and will remain stabilized during and after the shutdown. Consequently, if an instruction is received to erase the erase block after the shutdown, it is not necessary to rely on the information recorded in block 704 (which may no longer exist) to determine whether or not the erase block is stable.

Figure 8:
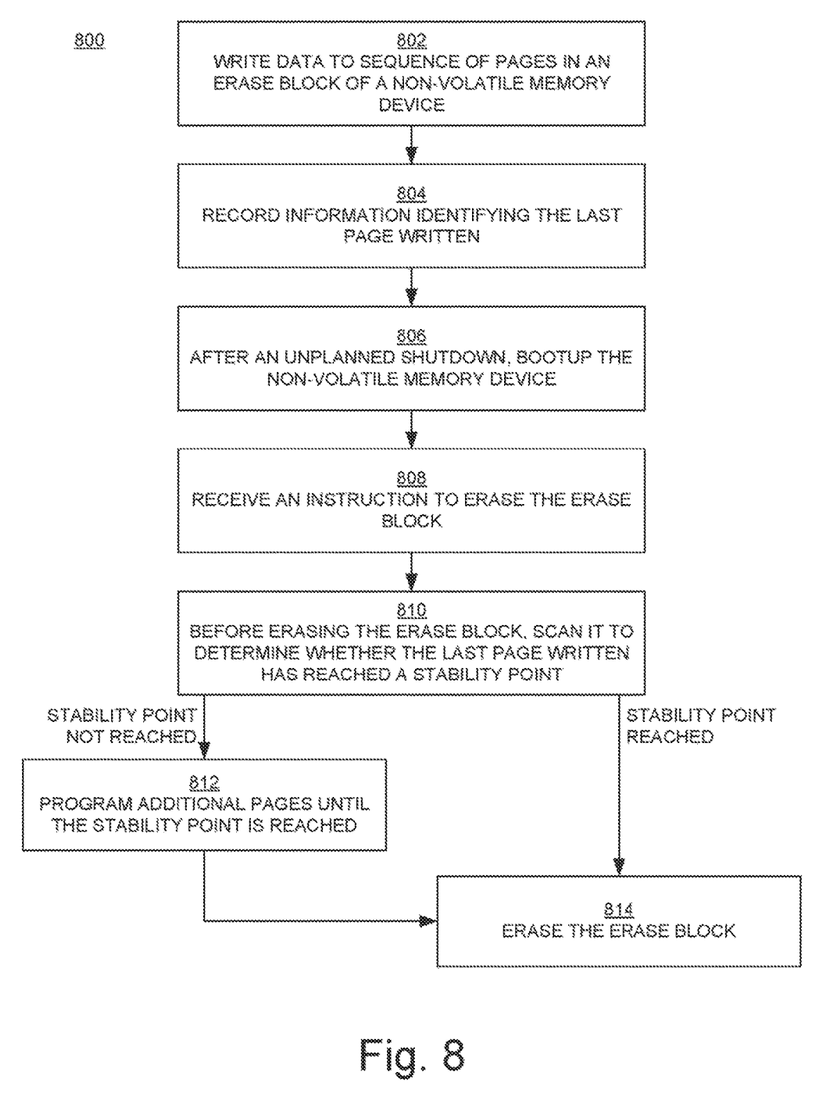
FIG. 8 is a flowchart of a method for responding to an unplanned shutdown of an NVMD in an embodiment according to the present invention.

FIG. 8 is a flowchart 800 of a method for responding to an unplanned shutdown of an NVMD (e.g., the NVMD 102 of FIG. 1) organized into erase blocks (e.g., the erase blocks 212 of FIG. 2) in an embodiment according to the present invention. The operations of the flowchart 800 are performed after the operations of the flowchart 500 are performed. In an embodiment, some or all of the operations of the flowchart 800 are performed in software executing on a computer system such as the system 100 of FIG. 1.

In block 802 of FIG. 8, data is written to a sequence of pages in an erase block of the NVMD.

In block 804, after the data is written to the erase block, information that identifies the last page in the sequence of pages is recorded, for example, in the memory 103 (e.g., DRAM) of FIG. 1.

In block 806, an unplanned shutdown of the NVMD occurs, the unplanned shutdown ends, and the NVMD is returned to operation (booted up). In an unplanned shutdown, the recorded state information about the last page written may be lost.

In block 808, after the unplanned shutdown, an instruction to erase the erase block is received. In particular, for example, an instruction may be received to erase the erase block on bootup following the unplanned shutdown.

In block 810, prior to erasing the erase block in response to the instruction, the erase block is scanned to determine whether the last page written has reached a stability point for the erase block. More specifically, the information about the last page written can be compared to the information recorded in block 514 of FIG. 5, to determine whether the last page written in the erase block is at or beyond a stability point for the erase block. The stability point for the erase block may be the last stability point in the erase block, or it may the stability point closest to but after the last page written. If a stability point has been reached, then the flowchart 800 proceeds to block 814; otherwise, the flowchart proceeds to block 812.

In block 812, when the last page written has not reached a stability point, additional sequential pages of the erase block are programmed (e.g., with dummy data) until the last page of the additional pages written is up to or past a stability point, similar to what is described above in the discussion of FIG. 6.

In block 814 of FIG. 8, when a stability point is reached, the erase block can be erased in response to the instruction of block 808.

Thus, the scanning operation of block 810 is performed only if the erase block is to be erased. Alternatively, all of the erase blocks in the NVMD can be scanned during bootup when the NVMD is returned to service. However, scanning all of the erase blocks can consume significant computational resources while increasing the time to complete the bootup. By instead scanning an erase block only if the erase block is to be erased, the computational cost of scanning is spread out over time and does not affect bootup time, and there is no visible increase in input/output latency when the scan is performed at erase time.

In summary, in embodiments according to the present invention, the stability point of each erase block can be determined and that information can be used to determine whether an erase block is stable and, if not, to stabilize the erase block before it is erased. Thus, embodiments according to the present invention improve the reliability of NVMDs (e.g., SSDs such as flash memory devices). Because it is no longer necessary to avoid potentially unstable erase blocks, the capacities of NVMDs are not reduced.

All or some of the operations represented by the blocks in the flowcharts 500, 600, 700, and 800 can be implemented as computer-executable instructions residing on some form of non-transitory computer-readable storage medium and performed by a computer system.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

Although the subject matter has been described in language specific to structural features and/or methodological acts, it is to be understood that the subject matter defined in the disclosure is not necessarily limited to the specific features or acts described above. Rather, the specific features and acts described above are disclosed as example forms of implementing the disclosure.

Embodiments according to the invention are thus described. While the present disclosure has been described in particular embodiments, it should be appreciated that the invention should not be construed as limited by such embodiments, but rather construed according to the following claims.

What is claimed is:

1. A computer-implemented method, comprising:
   writing data to a first set of pages in a first erase block of a non-volatile memory die of a non-volatile memory device;
   receiving an instruction to erase the first erase block;
   determining whether a last written page of the first set of pages has reached a stability point; and
   in response to determining that the last written page has not reached a stability point:
      writing data to a second set of pages in the first erase block until the stability point is reached.

2. The method of claim 1, further comprising:
   in response to determining that the last written page has reached a stability point:
      erasing the first erase block.

3. The method of claim 1, further comprising:
   comparing an erase time of a page of the first erase block to erase times of other pages of the first erase block; and
   determining the page as stable when the erase time is greater than the erase times of the other pages of the first erase block.

4. The method of claim 3, further comprising:
   identifying the page as the stability point when the page is determined as stable.

5. The method of claim 1, further comprising:
   determining whether the last written page in the first set of pages is a page identified as stable based on information identifying the last written page and information identifying the page identified as stable; and
   in response to determining that the last written page is not the page identified as stable:
      determining that the last written page has not reached the stability point.

6. The method of claim 5, further comprising:
   in response to determining that the last written page is the page identified as stable:
      determining that the last written page has reached the stability point; and
      executing the instruction to erase the first erase block.

7. The method of claim 1, further comprising:
   after an unplanned shutdown of the non-volatile memory device:
      receiving the instruction to erase the first erase block during a bootup of the non-volatile memory device;

in response to receiving the instruction, scanning pages of the first erase block during the bootup of the non-volatile memory device; and determining, based on the scanned pages, whether the last written page has reached the stability point.

8. The method of claim 1, wherein the first set of pages comprise a first sequence of contiguous pages of the first erase block.

9. The method of claim 1, wherein two or more of the second set of pages are contiguous pages in the first erase block.

10. The method of claim 1, wherein the second set of pages are different from the first set of pages.

11. A non-volatile memory device, comprising:
one or more non-volatile memory dies; and
a controller,
wherein the controller is configured to:
write data to a first set of pages in a first erase block of a first non-volatile memory die of the one or more non-volatile memory dies;
receive an instruction to erase the first erase block;
determining whether a last written page of the first set of pages has reached a stability point; and
when the last written page has not reached a stability point,
write data to a second set of pages in the first erase block until the stability point is reached.

12. The non-volatile memory device of claim 11, wherein the controller is configured to:
when the last written page has reached a stability point, execute the instruction to erase the first erase block.

13. The non-volatile memory device of claim 11, wherein the controller is configured to:
compare an erase time of a page of the first erase block to erase times of other pages of the first erase block; and
identify the page as stable when the erase time is greater than the erase times of the other pages of the first erase block.

14. The non-volatile memory device of claim 13, wherein the controller is configured to:
identify the page as the stability point when the erase time is greater than the erase times of the other pages of the first erase block.

15. The non-volatile memory device of claim 13, wherein the controller is configured to:
determine whether the last written page in the first set of pages is a page identified as stable based on information identifying the last written page and information identifying the page identified as stable;
when the last written page is not the page identified as stable, determine the last written page has not reached the stability point.

16. The non-volatile memory device of claim 15, wherein the controller is configured to:
when the last written page is the page identified as stable, determine that the last written page has reached the stability point; and
execute the instruction to erase the first erase block.

17. The non-volatile memory device of claim 11, wherein the controller is configured to:
after an unplanned shutdown of the non-volatile memory device:
receive the instruction to erase the first erase block during a bootup of the non-volatile memory device;
in response to the instruction to erase, scan pages of the first erase block during the bootup of the non-volatile memory device; and
determine, based on the scanned pages, whether the last written page has reached the stability point.

18. The non-volatile memory device of claim 11, wherein two or more of the first set of pages are a first sequence of contiguous pages of the first erase block, wherein two or more of the second set of pages are contiguous pages in the first erase block, and wherein the second set of pages are different from the first set of pages.

19. A non-volatile memory device, comprising:
one or more non-volatile memory dies;
means for writing data to a first set of pages in a first erase block of a non-volatile memory die of a non-volatile memory device;
means for receiving an instruction to erase the first erase block;
means for determining whether a last written page of the first set of pages has reached a stability point; and
in response to determining that the last written page has not reached a stability point:
means for writing data to a second set of pages in the first erase block until the stability point is reached.

20. The non-volatile memory device of claim 19, comprising:
in response to determining that the last written page has reached a stability point:
means for erasing the first erase block.

* * * * *